(12) United States Patent
Liu et al.

(10) Patent No.: US 10,566,960 B2
(45) Date of Patent: Feb. 18, 2020

(54) METAMATERIAL, AND METHOD AND APPARATUS FOR ADJUSTING FREQUENCY OF METAMATERIAL

(71) Applicant: SHENZHEN SUPER DATA LINK TECHNOLOGY LTD., Shenzhen (CN)

(72) Inventors: Ruopeng Liu, Shenzhen (CN); Chunlin Ji, Shenzhen (CN); Jing Nie, Shenzhen (CN); Yanqing Tan, Shenzhen (CN)

(73) Assignee: SHEN ZHEN KUANG-CHI HEZHONG TECHNOLOGY LTD., Shenshen (CN)

(*) Notice: Subject to any disclaimer, the term of this patent is extended or adjusted under 35 U.S.C. 154(b) by 0 days.

(21) Appl. No.: 16/184,411

(22) Filed: Nov. 8, 2018

(65) Prior Publication Data
US 2019/0074824 A1    Mar. 7, 2019

Related U.S. Application Data (63) Continuation of application No. PCT/CN2017/079578, filed on Apr. 6, 2017.

(51) Int. Cl.
*H03K 5/00* (2006.01)
*H03H 11/02* (2006.01)

(52) U.S. Cl.
CPC ......... *H03K 5/00006* (2013.01); *H03H 11/02* (2013.01)

(58) Field of Classification Search
CPC ..... H01Q 15/00; H03H 11/02; H03K 5/00006
USPC .................. 327/113, 603; 333/219.1, 235
See application file for complete search history.

(56) References Cited

U.S. PATENT DOCUMENTS

| | | | |
|---|---|---|---|
| 6,216,020 B1 | 4/2001 | Findikoglu | |
| 2008/0165079 A1* | 7/2008 | Smith | B82Y 20/00 343/911 R |
| 2010/0134215 A1* | 6/2010 | Lee | H01P 7/082 333/235 |

(Continued)

FOREIGN PATENT DOCUMENTS

| | | |
|---|---|---|
| CN | 102738591 A | 10/2012 |
| CN | 104051845 A | 9/2014 |
| CN | 205863402 U | 1/2017 |

*Primary Examiner* — William Hernandez
(74) *Attorney, Agent, or Firm* — Cantor Colburn LLP (57) ABSTRACT

The present invention discloses a metamaterial, and a method and an apparatus for adjusting a frequency of the metamaterial. The metamaterial includes a substrate material, and an electrically controllable microstructure unit array disposed on the substrate material and including a plurality of electrically controllable microstructure units. Each electrically controllable microstructure unit includes an external metal structure, an internal metal structure, and a varactor diode. The internal metal structure and the external metal structure define a ring-shaped channel. The varactor diode is disposed in the ring-shaped channel of each electrically controllable microstructure unit, and is configured for adjusting an operating frequency of each electrically controllable microstructure unit according to a voltage applied across the varactor diode. According to the present invention, a technical problem of failing to quickly and accurately adjust an operating frequency of the metamaterial in the prior art is solved.

20 Claims, 4 Drawing Sheets

(56) References Cited

U.S. PATENT DOCUMENTS

| | | | |
|---|---|---|---|
| 2010/0301971 A1* | 12/2010 | Yonak | H01P 1/20381 |
| | | | 333/219.1 |
| 2014/0211298 A1* | 7/2014 | Sayyah | H01Q 15/0086 |
| | | | 359/298 |
| 2016/0013531 A1* | 1/2016 | Casse | H01P 1/184 |
| | | | 333/161 |
| 2017/0141477 A1* | 5/2017 | Kim | H01Q 15/0086 |

* cited by examiner

METAMATERIAL, AND METHOD AND APPARATUS FOR ADJUSTING FREQUENCY OF METAMATERIAL

CROSS REFERENCE TO RELATED APPLICATIONS

This application is a continuation of PCT Application No. PCT/CN2017/079578 filed on Apr. 6, 2017, which claims priority to Chinese patent application No. 201610340612.4 filed May 19, 2016, both of which are incorporated herein by reference.

TECHNICAL FIELD

The present invention relates to the control field, and particularly relates to a metamaterial, and a method and an apparatus for adjusting a frequency of the metamaterial.

BACKGROUND

In the present society, a metamaterial is an artificial composite structure that exhibits superior physical properties not observed in the conventional material or nature. However, a unique electromagnetic feature of the metamaterial has a frequency band range, the unique electromagnetic feature is weakened or even disappeared if the metamaterial is out of the frequency band range.

Therefore, related technical persons begin to study a controllable metamaterial. In the recent research and development of these controllable metamaterial, there are mainly three types of controllable metamaterials: (1) a mechanical controllable metamaterial; (2) a controllable metamaterial loaded with a microwave switch; and (3) a controllable metamaterial loaded with a controllable material (for example, a ferrite, a liquid crystal material, and a graphene). For the mechanical controllable metamaterial, it is required that an amount of movement is precisely controlled; therefore, a volume of the metamaterial is relatively large, and an operation of the metamaterial is not easy. For the controllable metamaterial loaded with a microwave switch, a state of the metamaterial is related to a quantity of switches; and a sufficient quantity of switches need to be added to implement a sufficient quantity of states, thereby increasing complexity of a structure of the metamaterial. For the controllable metamaterial loaded with a controllable material, an adjustable frequency range of the metamaterial is not large; and a bias field needs to be externally applied to the metamaterial, thereby causing a complex structure of the metamaterial.

For the foregoing problems, no effective solution is currently proposed.

SUMMARY

Embodiments of the present invention provide a metamaterial, and a method and an apparatus for adjusting a frequency of the metamaterial, so as to at least solve a technical problem of failing to quickly and accurately adjust an operating frequency of the metamaterial in the prior art.

According to one aspect of the embodiment of the present invention, a metamaterial is provided, the metamaterial includes a substrate material, and an electrically controllable microstructure unit array disposed on the substrate material and including a plurality of electrically controllable microstructure units. Each electrically controllable microstructure unit includes an external metal structure, an internal metal structure, and a varactor diode. The internal metal structure and the external metal structure define a ring-shaped channel. The varactor diode is disposed in the ring-shaped channel of each electrically controllable microstructure unit, and is configured for adjusting an operating frequency of each electrically controllable microstructure unit according to a voltage applied across the varactor diode.

Further, the external metal structure is a rectangular structure or a square structure, the internal metal structure is a rectangular metal patch, and the internal metal structure is nested in the external metal structure.

Further, an adjustment range of the operating frequency is 0.3 GHz to 300 GHz.

Further, the voltage applied across the varactor diode is from 0V to 20V.

Further, a direction from a positive electrode to a negative electrode of the varactor diode or a direction from a negative electrode to a positive electrode of the varactor diode in the ring-shaped channel is the same as a direction of an electromagnetic field in the metamaterial.

Further, the substrate material is a nonmagnetic medium material, a permittivity of the substrate material is from 2 to 10, and a permeability of the substrate material is equal to 1.

Further, the dimensions of any two electrically controllable microstructure units in the electrically controllable microstructure unit array are the same.

Further, the metamaterial further includes a coaxial through hole disposed in the internal metal structure; wherein the internal metal structure is connected to a feed network through the coaxial through hole, and is configured for applying the voltage across the varactor diode.

Further, an electromagnetic wave perpendicularly incident to surfaces of the external metal structure and the internal metal structure is a plane wave, an amplitude and a phase of the electromagnetic wave are the same in a direction that is perpendicular to the incident direction.

Further, in a predetermined frequency band, a distance between any two adjacent electrically controllable microstructure units in the electrically controllable microstructure unit array is equal to a predetermined distance, the predetermined distance is from $\frac{1}{2}\lambda$ to $\lambda$, and $\lambda$ is a wavelength of an electromagnetic wave in the metamaterial.

Further, the varactor diode is specifically configured for reducing an operating frequency band of the metamaterial if a capacitance of the varactor diode is increased; or the varactor diode is specifically configured for increasing an operating frequency band of the metamaterial if a capacitance of the varactor diode is reduced; wherein the capacitance of the varactor diode is adjusted by adjusting the voltage applied across the varactor diode.

According to another aspect of the embodiment of the present invention, a method for adjusting a frequency of a metamaterial is further provided; the metamaterial includes a substrate material and an electrically controllable microstructure unit array that is attached on the substrate material and comprises a plurality of electrically controllable microstructure units, each electrically controllable microstructure unit includes an external metal structure, an internal metal structure, and a varactor diode; the internal metal structure and the external metal structure define a ring-shaped channel, the varactor diode is disposed in the ring-shaped channel of each electrically controllable microstructure unit; the method comprises: step 1: obtaining a voltage applied across a varactor diode; step 2: determining whether an operating frequency of the metamaterial satisfies a predetermined frequency; and step 3: adjusting the voltage across the varactor diode if it is determined that the operating frequency of the metamaterial does not satisfy the predetermined frequency, so as to make the operating frequency of the metamaterial satisfies the predetermined frequency; wherein the operating frequency of the metamaterial changes as the voltage across the varactor diode changes.

Further, the step 2 includes determining whether the operating frequency of the metamaterial is greater than or equal to the predetermined frequency; and the step 3 includes reducing the voltage applied across the varactor diode if it is determined that the operating frequency of the metamaterial is greater than or equal to the predetermined frequency; or increasing the voltage applied across the varactor diode if it is determined that the operating frequency of the metamaterial is smaller than the predetermined frequency.

Further, the step 3 includes: reducing an operating frequency band of the metamaterial if a capacitance of the varactor diode is increased; or increasing an operating frequency band of the metamaterial if a capacitance of the varactor diode is reduced; wherein the capacitance of the varactor diode is adjusted by adjusting the voltage applied across the varactor diode.

According to yet another aspect of the embodiment of the present invention, an apparatus for adjusting a frequency of a metamaterial is further provided; the metamaterial includes a substrate material and an electrically controllable microstructure unit array that is attached on the substrate material and comprises a plurality of electrically controllable microstructure units, each electrically controllable microstructure unit includes an external metal structure, an internal metal structure, and a varactor diode; the internal metal structure and the external metal structure define a ring-shaped channel, the varactor diode is disposed in the ring-shaped channel of each electrically controllable microstructure unit; the apparatus includes an obtaining unit configured for obtaining a voltage applied across a varactor diode, a determining unit configured for determining whether an operating frequency of the metamaterial satisfies a predetermined frequency, and an adjustment unit configured for adjusting the voltage across the varactor diode if it is determined that the operating frequency of the metamaterial does not satisfy the predetermined frequency; so as to make the operating frequency of the metamaterial satisfies the predetermined frequency; wherein the operating frequency of the metamaterial changes as the voltage across the varactor diode changes.

Further, the adjustment unit includes: a determining module, configured for determining whether the operating frequency of the metamaterial is greater than or equal to the predetermined frequency; a first control module, configured for reducing the voltage applied across the varactor diode if it is determined that the operating frequency of the metamaterial is greater than or equal to the predetermined frequency; and a second control module, configured for increasing the voltage applied across the varactor diode if it is determined that the operating frequency of the metamaterial is smaller than the predetermined frequency.

Further, the adjustment unit is specifically configured for reducing an operating frequency band of the metamaterial if a capacitance of the varactor diode is increased; or the adjustment unit is specifically configured for increasing an operating frequency band of the metamaterial if a capacitance of the varactor diode is reduced; wherein the capacitance of the varactor diode is adjusted by adjusting the voltage applied across the varactor diode.

Further, the external metal structure is a rectangular structure or a square structure, the internal metal structure is a rectangular metal patch, and the internal metal structure is nested in the external metal structure.

Further, the dimensions of any two electrically controllable microstructure units in the electrically controllable microstructure unit array are the same.

Further, the metamaterial further includes: a coaxial through hole, disposed in the internal metal structure; wherein the internal metal structure is connected to a feed network through the coaxial through hole, and is configured for applying the voltage across the varactor diode.

In the embodiments of the present invention, a substrate material and an electrically controllable microstructure unit array disposed on the substrate material are used; the electrically controllable microstructure unit array includes a plurality of electrically controllable microstructure units, and each electrically controllable microstructure unit includes an external metal structure, an internal metal structure and a varactor diode; the internal metal structure and the external metal structure define a ring-shaped channel; the varactor diode is disposed in the ring-shaped channel of each electrically controllable microstructure unit and is configured to adjust an operating frequency of each electrically controllable microstructure unit based on a voltage applied across the varactor diode. A varactor diode whose capacitance is variable is disposed in each electrically controllable microstructure unit in the electrically controllable microstructure unit array, to achieve an objective of adjusting the operating frequency of each electrically controllable microstructure unit. Therefore, a technical effect of adjusting an operating frequency of the metamaterial by using the varactor diode is obtained, and a technical problem of failing to quickly and accurately adjust an operating frequency of the metamaterial in the prior art is further solved.

BRIEF DESCRIPTION OF DRAWINGS

The drawings described herein provide further understanding of the present invention, and form a part of this application. Schematic embodiments of the present invention and descriptions thereof are used to explain the present invention but do not constitute an inappropriate limitation on the present invention. In the drawings.

DESCRIPTION OF EMBODIMENTS

To make a person skilled in the art better understand solutions of the present invention, the following clearly and completely describes the technical solutions in the embodiments of the present invention with reference to the accompanying drawings in the embodiments of the present invention. Apparently, the described embodiments are some but not all of the embodiments of the present invention. All other embodiments obtained by a person of ordinary skill in the art based on the embodiments of the present invention without creative efforts shall fall within the protection scope of the present invention.

It should be noted that terms such as "first" and "second" in the specification, claims, and accompanying drawings of the present invention are used to distinguish between similar objects, and are not necessarily used to describe a particular sequence or order. It should be understood that data used in such a way may be interchangeable in a proper circumstance, so that the embodiments of the present invention described herein can be implemented in a sequence other than those shown in the drawings or described herein. Moreover, terms "including", "having", and any other variant thereof are intended to cover a non-exclusive inclusion. For example, a process, a method, a system, a product, or a device that includes a series of steps or units is not necessarily limited to those expressly listed steps or units, but may include other steps or units that are not expressly listed or that are inherent to such a process, method, product, or device.

Figure 1:
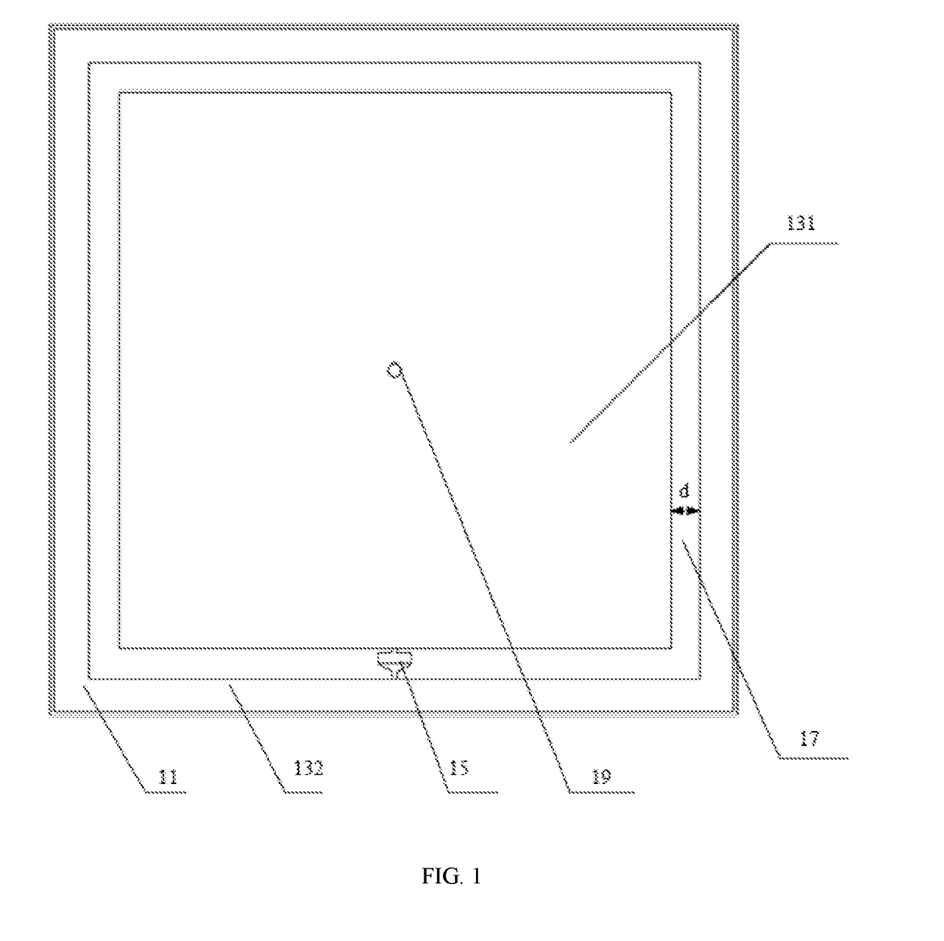
FIG. 1 illustrates a metamaterial according to an embodiment of the present invention.
Figure 2:
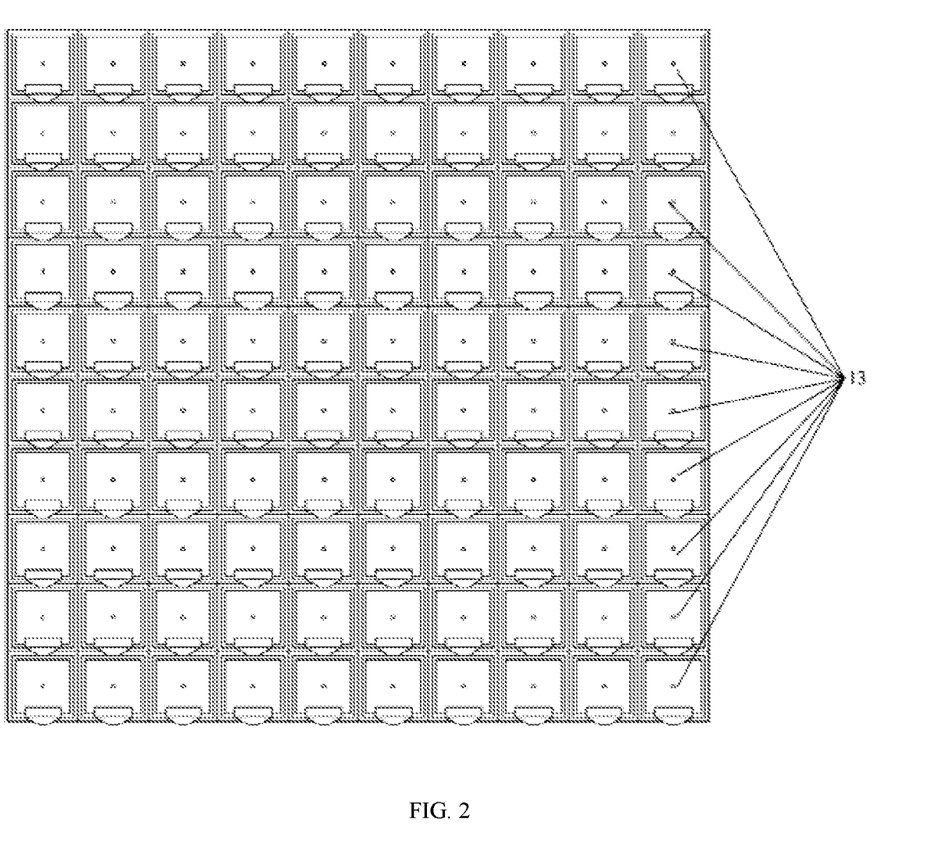
FIG. 2 illustrates a structure of an electrically controllable microstructure unit array according to an embodiment of the present invention.

According to embodiments of the present invention, an embodiment of a metamaterial is provided. The embodiments of the present invention is described according to the following FIG. 1 and FIG. 2. FIG. 1 illustrates a metamaterial according to an embodiment of the present invention. FIG. 2 illustrates a structure of an electrically controllable microstructure unit array according to an embodiment of the present invention. As shown in FIG. 1 and FIG. 2, the metamaterial includes a substrate material 11, an electrically controllable microstructure unit array, and a varactor diode 15. The electrically controllable microstructure unit array includes at least one electrically controllable microstructure unit 13.

The electrically controllable microstructure unit array is attached on the substrate material 11, the electrically controllable microstructure unit array includes a plurality of electrically controllable microstructure units 13; each electrically controllable microstructure unit includes an external metal structure, an internal metal structure, and a varactor diode 15. The internal metal structure and the external metal structure define a ring-shaped channel.

The varactor diode 15 is disposed in the ring-shaped channel of each electrically controllable microstructure unit 13, and is configured for adjusting an operating frequency of each electrically controllable microstructure unit 13 according to a voltage applied across the varactor diode 15.

In the embodiment of the present invention, the varactor diode 15 is disposed in each electrically controllable microstructure unit 13 of the electrically controllable microstructure unit array, and the capacitance of the varactor diode 15 is variable, so as to achieve a purpose to adjust an operating frequency of each electrically controllable microstructure unit 13. Therefore, a technical effect of adjusting an operating frequency of the metamaterial by using the varactor diode 15 is obtained, and a technical problem of failing to quickly and accurately adjust an operating frequency of the metamaterial in the prior art is further solved.

FIG. 2 illustrates a 10×10 electrically controllable microstructure unit array. The electrically controllable microstructure unit array includes 10×10 electrically controllable microstructure units 13. As shown in FIG. 2, in the embodiment of the present invention, the dimensions of any two electrically controllable microstructure units 13 in the electrically controllable microstructure unit array are the same, and the electrically controllable microstructure units 13 are closely arranged. That is, the electrically controllable microstructure unit array includes a plurality of same electrically controllable microstructure units 13, and a structural diagram of any electrically controllable microstructure unit 13 in the electrically controllable microstructure unit array is shown in FIG. 1. In FIG. 1, the electrically controllable microstructure unit 13 includes an external metal structure 132 and an internal metal structure 131, the internal metal structure 131 and the external metal structure 132 define a ring-shaped channel 17, the width of the ring-shaped channel 17 is equal to d. In the electrically controllable microstructure unit 13 of FIG. 2, the external metal structure 132 may be a rectangular structure or a square structure, the internal metal structure 131 may be a rectangular metal patch. As shown in FIG. 1, the internal metal structure 131 is nested in the external metal structure 132, so as to form the ring-shaped channel 17.

The material of the external metal structure 132 and the internal metal structure 131 is at least one of the following: copper, silver, and gold. Considering cost of the electrically controllable metamaterial, copper is preferably selected as the material of the external metal structure 132 and the internal metal structure 131. It should be noted that, if copper is selected as the material of the external metal structure 132 and the internal metal structure 131, a surface of the copper is plated with gold, so as to prevent the electrically controllable metamaterial, which is made of copper, from being oxidized, due to use of the electrically controllable metamaterial for a long period of time.

In the embodiment of the present invention, the varactor diode 15 is further installed in the ring-shaped channel 17 of each electrically controllable microstructure unit 13. The varactor diode 15 is a diode whose capacitance is variable. If a variable reverse bias direct current voltage is applied across the varactor diode 15, a capacitance of the varactor diode 15 is changed. Based on a formula $\omega = 1/(2\pi\sqrt{LC})$, it can be learned that if the capacitance of the varactor diode 15 changes, $\omega$ of the electrically controllable microstructure unit 13 changes, where $\omega$ is an instantaneous operating frequency of the electrically controllable microstructure unit 13.

In an alternative implementation of the present invention, an adjustment range of the operating frequency of each electrically controllable microstructure unit 13 is 0.3 GHz to 300 GHz. That is, the operating frequency of each electrically controllable microstructure unit 13 can be adjusted in the adjustment range.

Further, a range of the voltage applied across the varactor diode 15 is 0V to 20V. The voltage applied across the varactor diode 15 is adjusted in the range, such that the operating frequency of each electrically controllable microstructure unit 13 is adjusted from 0.3 GHz to 300 GHz.

In this embodiment of the present invention, the varactor diode 15 may be installed in a location (for example, a lower side channel of the ring-shaped channel 17) shown in FIG. 1 and FIG. 2. Or, the varactor diode 15 may be disposed in a left side channel, a right side channel, or an upper side channel of the ring-shaped channel 17. It should be noted that, regardless of the installing of the varactor diode 15 in which location of the ring-shaped channel 17, it needs to be ensured that a direction from a positive electrode to a negative electrode of the varactor diode 15 or a direction from a negative electrode to a positive electrode of the varactor diode 15 in the ring-shaped channel is the same as a direction of an electromagnetic field in the metamaterial. For example, if the direction of the electromagnetic field in the metamaterial is from a top of the metamaterial to a bottom of the metamaterial and is perpendicular to surfaces of the metamaterial, the varactor diode 15 may be disposed in the location shown in FIG. 1 and FIG. 2.

In the embodiment of the present invention, the electrically controllable metamaterial further includes the substrate material 11, wherein electrically controllable microstructure unit array is attached on the substrate material 11. The substrate material 11 may be a nonmagnetic medium material, a permittivity of the substrate material 11 is from 2 to 10, and a permeability of the substrate material 11 is equal to 1. As shown in FIG. 1, the ring-shaped channel 17 is a hollow channel, the ring-shaped channel 17 is a gap between the internal metal structure 131 and the external metal structure 132, such that a material exposed out of the ring-shaped channel 17 is the substrate material 11.

In the embodiment of the present invention, the metamaterial further includes a coaxial through hole 19. As shown in FIG. 1 and FIG. 2, the coaxial through hole 19 is disposed in the internal metal structure 131, the internal metal structure 131 is connected to a feed network through the coaxial through hole 19 and is configured for applying a reverse bias voltage across the varactor diode 15.

Optionally, when an electromagnetic wave is perpendicularly incident to surfaces of the external metal structure 132 and the internal metal structure 131, the electromagnetic wave may be a plane wave, an amplitude and a phase of the electromagnetic wave are the same in a direction that is perpendicular to the incident direction.

In the embodiment of the present invention, when an operating frequency of the metamaterial is in a predetermined frequency band, a distance between any two adjacent electrically controllable microstructure units 13 in the electrically controllable microstructure unit array is equal to a predetermined distance. Wherein, the predetermined distance is from $\frac{1}{2}\lambda$ to $\lambda$, and $\lambda$ is a wavelength of an electromagnetic wave in the metamaterial. It should be noted that a distance between any two adjacent electrically controllable microstructure units 13 of the metamaterial in one frequency band is not equal to a distance between any two adjacent electrically controllable microstructure units 13 of the metamaterial in another frequency band, the one frequency band is different from the another frequency band.

A specific embodiment of the present invention is described as following, for example, a researcher designs a metamaterial, it is required that an operating frequency band of the metamaterial is 13.4 GHz-17.5 GHz, and a selected central operating frequency of the metamaterial is 15 GHz. In this case, 20 mm may be selected as a wavelength $\lambda$ of an electromagnetic wave in the metamaterial based on the selected operating frequency band, copper may be selected as the materials of the external metal structure 132 and the internal metal structure 131, and the substrate material 11 may be F4B material. Wherein, a permittivity $\varepsilon$ of the substrate material 11 is equal to 3.0, a permeability $\mu$ of the substrate material 11 is equal to 1, and each electrically controllable microstructure unit 13 in the electrically controllable microstructure unit array may be a square ring shape. And wherein a length and a width of an external edge of the external metal structure 132 in each electrically controllable microstructure unit 13 may be equal, for example, the length and the width are equal to 7.5 mm (a=7.5 mm); a length and a width of the internal metal structure 131 (for example, a rectangular metal patch) may be 6 mm; a width of the ring-shaped channel 17 may be 0.75 mm; a thickness of the external metal structure 132 and the internal metal structure 131 may be 0.035 mm; a thickness of the substrate material 11 may be 0.3 mm; a distance between any two adjacent electrically controllable microstructure units 13 in the electrically controllable microstructure unit array is equal to a predetermined distance, the predetermined distance may be 7.5 mm.

After designing the foregoing metamaterial, the metamaterial may be applied to a specific device, for example the metamaterial is applied to an antenna. For example, the foregoing designed electrically controllable metamaterial may be applied to a panel antenna. When the metamaterial is the electrically controllable metamaterial that includes the varactor diode 15, the voltage across the varactor diode 15 may be controlled to adjust phase shift distribution of the electrically controllable microstructure unit array, so as to implement wide angle and continuous scanning.

Figure 3:
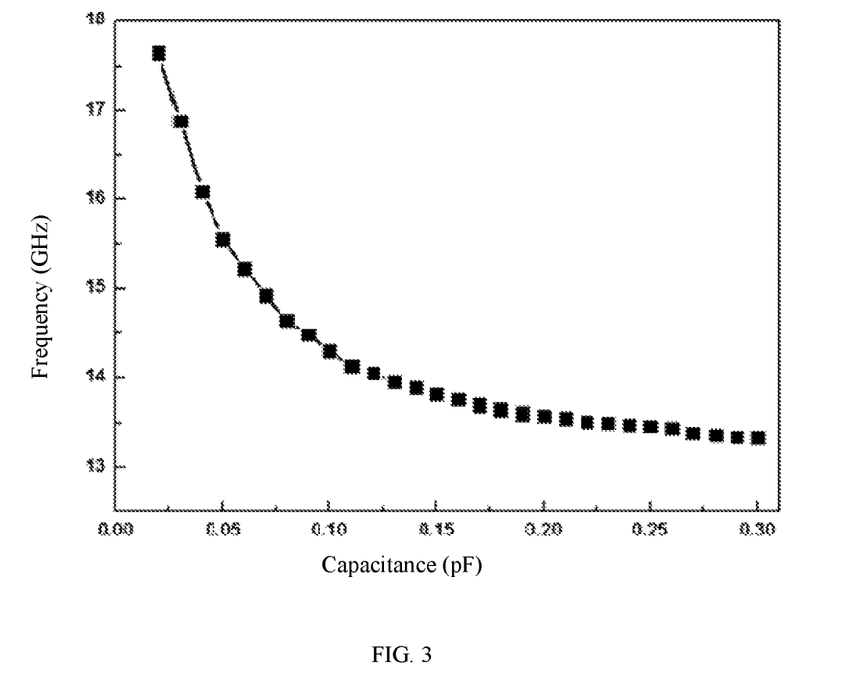
FIG. 3 illustrates a relationship between a capacitance and a frequency according to an embodiment of the present invention.

A process of adjusting a frequency of the foregoing designed metamaterial is specifically described as the following, when the operating frequency band of the electrically controllable metamaterial is 13.4 GHz-17.5 GHz, the capacitance of the varactor diode 15 may be varied between 0.02 pF and 0.32 pF, a relationship between a frequency and a capacitance is shown in FIG. 3. As shown in FIG. 3, if the capacitance gradually increases, the frequency gradually decreases; if the capacitance gradually decreases, the frequency gradually increases; that is, there is an inversely proportional relationship between the capacitance and the frequency. In the embodiment of the present invention, if the capacitance of the varactor diode 15 increases, the operating frequency of the electrically controllable metamaterial decreases; if the capacitance of the varactor diode 15 decreases, the operating frequency of the electrically controllable metamaterial increases. Therefore, the operating frequency of the electrically controllable metamaterial may be adjusted within the predetermined frequency band by adjusting the capacitance of the varactor diode 15. For example, the selected central operating frequency of the electrically controllable metamaterial is 15 GHz, and if it is detected that a current operating frequency of the electrically controllable metamaterial is greater than 15 GHz, the capacitance of the varactor diode 15 can be increased to reduce the current operating frequency of the electrically controllable metamaterial. Wherein, the capacitance of the varactor diode 15 can be adjusted by adjusting the reverse bias voltage applied across the varactor diode 15, therefore the operating frequency of the electrically controllable metamaterial can be adjusted by adjusting the capacitance of the varactor diode 15.

According to above descriptions, in the foregoing embodiment of the present invention, the capacitance of the varactor diode 15 can be adjusted by adjusting the voltage applied across the varactor diode 15, and then the operating frequency of the electrically controllable metamaterial is adjusted based on the formula $\omega=1/(2\pi\sqrt{LC})$. According to the foregoing manner of adjusting an operating frequency of an electrically controllable metamaterial in the present invention, the operating frequency of the electrically controllable metamaterial can be adjusted in the predetermined frequency band; and a structure of the metamaterial is simple, no complex structure of the metamaterial is required, such that manufacturing of the metamaterial is facilitated. In the foregoing manner, it is ensured that the entire metamaterial does not change, and an electromagnetic performance of the metamaterial can be continuously controlled by controlling the bias voltage applied across the varactor diode 15.

Figure 4:
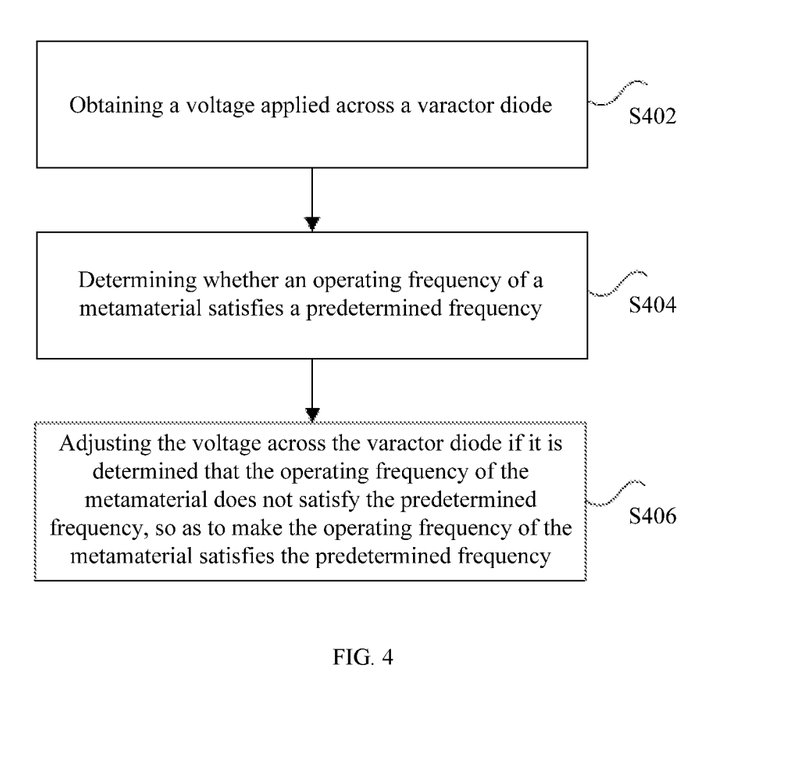
FIG. 4 illustrates a method for adjusting a frequency of a metamaterial according to an embodiment of the present invention.

According to embodiments of the present invention, a method for adjusting a frequency of a metamaterial is further provided. FIG. 4 illustrates a method for adjusting a frequency of a metamaterial according to an embodiment of the present invention. As show in FIG. 4, the method includes the following steps.

Step S402: obtaining a voltage applied across a varactor diode 15, wherein this step is the step 1.

Step S404: determining whether an operating frequency of a metamaterial satisfies a predetermined frequency, wherein this step is the step 2.

Step S406: adjusting the voltage across the varactor diode if it is determined that the operating frequency of the metamaterial does not satisfy the predetermined frequency, so as to make the operating frequency of the metamaterial satisfies the predetermined frequency; wherein the operating frequency of the metamaterial changes as the voltage across the varactor diode 15 changes, and this step is the step 3.

In detail, determining whether an operating frequency of a metamaterial satisfies a predetermined frequency includes: determining whether the operating frequency of the metamaterial is greater than or equal to the predetermined frequency; and adjusting the voltage across the varactor diode 15 if it is determined that the operating frequency of the metamaterial does not satisfy the predetermined frequency includes: reducing the voltage applied across the varactor diode 15 if it is determined that the operating frequency of the metamaterial is greater than or equal to the predetermined frequency; and increasing the voltage applied across the varactor diode 15 if it is determined that the operating frequency of the metamaterial is smaller than the predetermined frequency.

Specifically, in the metamaterial shown in FIG. 1 and FIG. 2, a bias voltage may be applied across the varactor diode 15, and further, a capacitance of the varactor diode 15 is adjusted through the applied bias voltage. For example, if an operating frequency band of a metamaterial is 13.4 GHz-17.5 GHz, an operating frequency of the controllable metamaterial can be adjusted in the operating frequency band through the applied bias voltage. It is assumed that a center operating frequency (namely, a predetermined frequency) of the controllable metamaterial is 15 GHz, but the current operating frequency of the controllable metamaterial is 16 GHz. In this case, the operating frequency of the controllable metamaterial needs to be reduced. It can be seen from the relationship diagram shown in FIG. 3 that the operating frequency of the controllable metamaterial can be reduced by increasing the capacitance of the varactor diode 15. Therefore, the capacitance of the varactor diode 15 may be increased by adjusting the bias voltage applied across the varactor diode 15, so as to reduce the operating frequency of the controllable metamaterial.

In the embodiment of the present invention, the varactor diode 15 is disposed in each electrically controllable microstructure unit 13 of the electrically controllable microstructure unit array, and the capacitance of the varactor diode 15 is variable, so as to achieve a purpose to adjust an operating frequency of each electrically controllable microstructure unit 13. Therefore, a technical effect of adjusting an operating frequency of the metamaterial by using the varactor diode 15 is obtained, and a technical problem of failing to quickly and accurately adjust an operating frequency of the metamaterial in the prior art is further solved.

Figure 5:
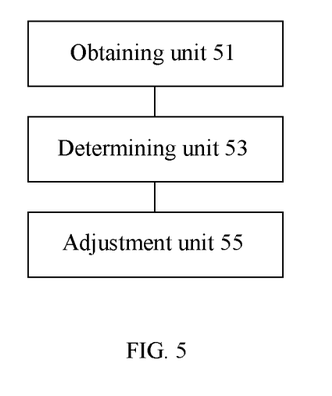
FIG. 5 illustrates an apparatus for adjusting a frequency of a metamaterial according to an embodiment of the present invention.

According to embodiments of the present invention, an embodiment of an apparatus for adjusting a frequency of a metamaterial is further provided. FIG. 5 illustrates an apparatus for adjusting a frequency of a metamaterial according to an embodiment of the present invention. As shown in FIG. 5, the apparatus includes an obtaining unit 51, a determining unit 53, and an adjustment unit 55.

The obtaining unit 51 is configured for obtaining a voltage applied across the varactor diode 15.

The determining unit 53 is configured for determining whether an operating frequency of the metamaterial satisfies a predetermined frequency.

The adjustment unit 55 is configured for adjusting the voltage across the varactor diode if it is determined that the operating frequency of the metamaterial does not satisfy the predetermined frequency, so as to make the operating frequency of the metamaterial satisfies the predetermined frequency; wherein the operating frequency of the metamaterial changes as the voltage across the varactor diode changes.

The adjustment unit 55 includes a determining module, a first control module, and a second control module. The determining module is configured for determining whether the operating frequency of the metamaterial is greater than or equal to the predetermined frequency. The first control module is configured for reducing the voltage applied across the varactor diode if it is determined that the operating frequency of the metamaterial is greater than or equal to the predetermined frequency. The second control module is configured for increasing the voltage applied across the varactor diode if it is determined that the operating frequency of the metamaterial is smaller than the predetermined frequency.

In the embodiment of the present invention, the varactor diode 15 is disposed in each electrically controllable microstructure unit 13 of the electrically controllable microstructure unit array, and the capacitance of the varactor diode 15 is variable, so as to achieve a purpose to adjust an operating frequency of each electrically controllable microstructure unit 13. Therefore, a technical effect of adjusting an operating frequency of the metamaterial by using the varactor diode 15 is obtained, and a technical problem of failing to quickly and accurately adjust an operating frequency of the metamaterial in the prior art is further solved.

Sequence numbers of the foregoing embodiments of the present invention are merely used for description, and do not indicate superiority or inferiority of the embodiments.

In the foregoing embodiments of the present invention, descriptions of the embodiments have respective emphases. For a part not described in detail in an embodiment, reference may be made to related descriptions in another embodiment.

In the several embodiments provided in this application, it should be understood that the disclosed technical content may be implemented in other manners. The described apparatus embodiments are merely examples. For example, the unit division is merely logical function division and may be other division in actual implementation. For example, a plurality of units or components may be combined or integrated into another system, or some features may be ignored or not performed. In addition, the shown or discussed mutual couplings or direct couplings or communication connections may be implemented by using some interfaces. The indirect couplings or communication connections between the units or modules may be implemented in electrical or other forms.

The units described as separate parts may or may not be physically separated, and parts shown as units may or may not be physical units, may be located in one position, or may be distributed on a plurality of units. Some or all of the units may be selected according to actual requirements to achieve the objectives of the solutions of the embodiments.

In addition, functional units in the embodiments of the present invention may be integrated into one processing unit, or each of the units may exist alone physically, or two or more units are integrated into one unit. The integrated unit may be implemented in a form of hardware, or may be implemented in a form of a software functional unit.

When the integrated unit is implemented in the form of a software functional unit and sold or used as an independent product, the integrated unit may be stored in a computer-readable storage medium. Based on such an understanding, the technical solutions of the present invention essentially, or the part contributing to the prior art, or all or some of the technical solutions may be implemented in the form of a software product. The computer software product is stored in a storage medium and includes several instructions for instructing a computer device (which may be a personal computer, a server, a network device, or the like) to perform all or some of the steps of the methods described in the embodiments of the present invention. The foregoing storage medium includes any medium that can store program code, such as a USB flash drive, a read-only memory (ROM, Read-Only Memory), a random access memory (RAM, Random Access Memory), a removable hard disk, a magnetic disk, or an optical disc.

The foregoing descriptions are merely preferred implementations of the present invention. It should be noted that, improvements and modifications may be further made by a person of ordinary skill in the art without departing from the principles of the present invention, and these improvements and modifications shall also be construed as falling within the protection scope of the present invention.

What is claimed is:

1. A metamaterial, comprising:
a substrate material; and
an electrically controllable microstructure unit array attached on the substrate material and comprising a plurality of electrically controllable microstructure units; wherein each electrically controllable microstructure unit comprises:
an external metal structure;
an internal metal structure; wherein the internal metal structure and the external metal structure define a ring-shaped channel; and
a varactor diode disposed in the ring-shaped channel of each electrically controllable microstructure unit; wherein the varactor diode is configured for adjusting an operating frequency of each electrically controllable microstructure unit according to a voltage applied across the varactor diode;
wherein the voltage applied across the varactor diode is a variable reverse bias direct current voltage.

2. The metamaterial of claim 1, wherein the external metal structure is a rectangular structure or a square structure, the internal metal structure is a rectangular metal patch, and the internal metal structure is nested in the external metal structure.

3. The metamaterial of claim 1, wherein an adjustment range of the operating frequency is 0.3 GHz to 300 GHz.

4. The metamaterial of claim 1, wherein the voltage applied across the varactor diode is from 0V to 20V.

5. The metamaterial of claim 1, wherein a direction from a positive electrode to a negative electrode of the varactor diode or a direction from the negative electrode to the positive electrode of the varactor diode in the ring-shaped channel is the same as a direction of an electromagnetic field in the metamaterial.

6. The metamaterial of claim 1, wherein the substrate material is a nonmagnetic medium material, a permittivity of the substrate material is from 2 to 10, and a permeability of the substrate material is equal to 1.

7. The metamaterial of claim 1, wherein the dimensions of any two electrically controllable microstructure units in the electrically controllable microstructure unit array are the same.

8. The metamaterial of claim 1, wherein the metamaterial further comprises:
a coaxial through hole disposed in the internal metal structure; wherein the internal metal structure is connected to a feed network through the coaxial through hole, and is configured for applying the voltage across the varactor diode.

9. The metamaterial of claim 1, wherein an electromagnetic wave perpendicularly incident to surfaces of the external metal structure and the internal metal structure is a plane wave, an amplitude and a phase of the electromagnetic wave are the same in a direction that is perpendicular to the incident direction.

10. The metamaterial of claim 1, wherein in a predetermined frequency band, a distance between any two adjacent electrically controllable microstructure units in the electrically controllable microstructure unit array is equal to a predetermined distance, the predetermined distance is from $\frac{1}{2}\lambda$ to $\lambda$, and $\lambda$ is a wavelength of an electromagnetic wave in the metamaterial.

11. The metamaterial of claim 1, wherein the varactor diode is specifically configured for reducing an operating frequency band of the metamaterial if a capacitance of the varactor diode is increased; or
the varactor diode is specifically configured for increasing an operating frequency band of the metamaterial if a capacitance of the varactor diode is reduced; wherein the capacitance of the varactor diode is adjusted by adjusting the voltage applied across the varactor diode.

12. A method for adjusting a frequency of a metamaterial, the metamaterial comprising a substrate material and an electrically controllable microstructure unit array that is attached on the substrate material and comprises a plurality of electrically controllable microstructure units, each electrically controllable microstructure unit comprising an external metal structure, an internal metal structure, and a varactor diode; the internal metal structure and the external metal structure defining a ring-shaped channel, the varactor diode disposed in the ring-shaped channel of each electrically controllable microstructure unit; wherein the method comprises:
step 1: obtaining a voltage applied across the varactor diode, wherein the voltage applied across the varactor diode is a variable reverse bias direct current voltage;
step 2: determining whether an operating frequency of the metamaterial satisfies a predetermined frequency; and
step 3: adjusting the voltage across the varactor diode if it is determined that the operating frequency of the metamaterial does not satisfy the predetermined frequency, so as to make the operating frequency of the metamaterial satisfy the predetermined frequency; wherein the operating frequency of the metamaterial changes as the voltage across the varactor diode changes.

13. The method of claim 12, wherein the step 2 comprises:
determining whether the operating frequency of the metamaterial is greater than or equal to the predetermined frequency; and
wherein the step 3 comprises:

reducing the voltage applied across the varactor diode if it is determined that the operating frequency of the metamaterial is greater than or equal to the predetermined frequency; or increasing the voltage applied across the varactor diode if it is determined that the operating frequency of the metamaterial is smaller than the predetermined frequency.

14. The method of claim 12, wherein the step 3 comprises:
reducing an operating frequency band of the metamaterial if a capacitance of the varactor diode is increased; or increasing an operating frequency band of the metamaterial if a capacitance of the varactor diode is reduced; wherein the capacitance of the varactor diode is adjusted by adjusting the voltage applied across the varactor diode.

15. An apparatus for adjusting a frequency of a metamaterial, the metamaterial comprising a substrate material and an electrically controllable microstructure unit array that is attached on the substrate material and comprises a plurality of electrically controllable microstructure units, each electrically controllable microstructure unit comprising an external metal structure, an internal metal structure, and a varactor diode; the internal metal structure and the external metal structure defining a ring-shaped channel, the varactor diode disposed in the ring-shaped channel of each electrically controllable microstructure unit; wherein the apparatus comprises:

an obtaining unit, configured for obtaining a voltage applied across the varactor diode, wherein the voltage applied across the varactor diode is a variable reverse bias direct current voltage;

a determining unit, configured for determining whether an operating frequency of the metamaterial satisfies a predetermined frequency; and an adjustment unit, configured for adjusting the voltage across the varactor diode if it is determined that the operating frequency of the metamaterial does not satisfy the predetermined frequency, so as to make the operating frequency of the metamaterial satisfy the predetermined frequency; wherein the operating frequency of the metamaterial changes as the voltage across the varactor diode changes.

16. The apparatus of claim 15, wherein the adjustment unit comprises:

a determining module, configured for determining whether the operating frequency of the metamaterial is greater than or equal to the predetermined frequency;

a first control module, configured for reducing the voltage applied across the varactor diode if it is determined that the operating frequency of the metamaterial is greater than or equal to the predetermined frequency; and a second control module, configured for increasing the voltage applied across the varactor diode if it is determined that the operating frequency of the metamaterial is smaller than the predetermined frequency.

17. The apparatus of claim 15, wherein the adjustment unit is specifically configured for reducing an operating frequency band of the metamaterial if a capacitance of the varactor diode is increased; or the adjustment unit is specifically configured for increasing an operating frequency band of the metamaterial if a capacitance of the varactor diode is reduced;

wherein the capacitance of the varactor diode is adjusted by adjusting the voltage applied across the varactor diode.

18. The apparatus of claim 15, wherein the external metal structure is a rectangular structure or a square structure, the internal metal structure is a rectangular metal patch, and the internal metal structure is nested in the external metal structure.

19. The apparatus of claim 15, wherein the dimensions of any two electrically controllable microstructure units in the electrically controllable microstructure unit array are the same.

20. The apparatus of claim 15, wherein the metamaterial further comprises:

a coaxial through hole, disposed in the internal metal structure; wherein the internal metal structure is connected to a feed network through the coaxial through hole, and is configured for applying the voltage across the varactor diode.

* * * * *